United States Patent
Tayebi et al.

(10) Patent No.: US 9,630,834 B2
(45) Date of Patent: Apr. 25, 2017

(54) WAFER SCALE MONOLITHIC CMOS-INTEGRATION OF FREE- AND NON-FREE-STANDING METAL- AND METAL ALLOY-BASED MEMS STRUCTURES IN A SEALED CAVITY

(71) Applicants: Noureddine Tayebi, Palo Alto, CA (US); Hao Luo, Milpitas, CA (US)

(72) Inventors: Noureddine Tayebi, Palo Alto, CA (US); Hao Luo, Milpitas, CA (US)

(73) Assignee: InSense, Inc., Palo Alto, CA (US)

( * ) Notice: Subject to any disclaimer, the term of this patent is extended or adjusted under 35 U.S.C. 154(b) by 0 days.

(21) Appl. No.: 14/306,139

(22) Filed: Jun. 16, 2014

(65) Prior Publication Data

US 2015/0360936 A1    Dec. 17, 2015

(51) Int. Cl.
*B81C 1/00* (2006.01)
*B81B 7/02* (2006.01)

(52) U.S. Cl.
CPC .............. *B81C 1/0023* (2013.01); *B81B 7/02* (2013.01); *B81C 1/00246* (2013.01)

(58) Field of Classification Search
CPC ..... H01L 2924/1433; H01L 2924/1461; H01L 41/08–41/1138; H01L 27/04; H01L 41/333–41/337; B81B 7/008; B81C 1/0023; B81C 1/00246
See application file for complete search history.

(56) References Cited

U.S. PATENT DOCUMENTS

| | | | |
|---|---|---|---|
| 6,174,820 B1 * | 1/2001 | Habermehl et al. | 438/745 |
| 6,849,471 B2 * | 2/2005 | Patel et al. | 438/21 |
| 7,008,812 B1 * | 3/2006 | Carley | B81B 7/0077 438/52 |
| 7,012,489 B2 * | 3/2006 | Sherrer | H01P 1/08 29/828 |
| 7,104,129 B2 | 9/2006 | Nasiri | |
| 8,349,635 B1 * | 1/2013 | Gan et al. | 438/50 |
| 8,445,306 B2 * | 5/2013 | Lindgren | H01H 59/0009 257/415 |
| 8,866,238 B2 * | 10/2014 | Classen | B81C 1/00246 257/226 |
| 2008/0023813 A1 * | 1/2008 | Hartwell | B81B 3/0062 257/686 |
| 2009/0108381 A1 * | 4/2009 | Buchwalter et al. | 257/415 |
| 2011/0068374 A1 * | 3/2011 | Tan | B81C 1/00238 257/254 |

(Continued)

*Primary Examiner* — Jessica Manno
*Assistant Examiner* — Sean Hagan

(57) ABSTRACT

An assembly of metallic MEMS structures directly fabricated on planarized CMOS substrates, containing the application-specific integrated circuit (ASIC), by direct deposition and subsequent microfabrication steps on the ASIC interconnect layers, with integrated capping for packaging, is provided. The MEMS structures comprise at least one MEMS device element, with or without moveable parts anchored on the CMOS ASIC wafer with electrical contact provided via the metallic interconnects of the ASIC. The MEMS structures can also be made of metallic alloys, conductive oxides and amorphous semiconductors. The integrated capping, which provides a sealed cavity, is accomplished through bonding pads defined in the post-processing of the CMOS substrate.

16 Claims, 15 Drawing Sheets

(56) References Cited

U.S. PATENT DOCUMENTS

| | | | |
|---|---|---|---|
| 2011/0150031 A1* | 6/2011 | Abdelmoneum | G01K 7/32 374/117 |
| 2011/0180943 A1* | 7/2011 | Claes | B81B 7/0077 257/787 |
| 2011/0187227 A1* | 8/2011 | Chen et al. | 310/318 |
| 2012/0194286 A1* | 8/2012 | Montanya Silvestre | B81C 1/00246 331/36 C |
| 2013/0169383 A1* | 7/2013 | Adkisson | B81B 7/008 333/186 |

* cited by examiner

WAFER SCALE MONOLITHIC CMOS-INTEGRATION OF FREE- AND NON-FREE-STANDING METAL- AND METAL ALLOY-BASED MEMS STRUCTURES IN A SEALED CAVITY

TECHNICAL FIELD

Embodiments of the invention are in the field of microelectromechanical systems (MEMS) (also called microsystems) and methods for sensing and actuation, and, in particular, inertial and magnetic field sensing without excluding resonators, chemical, environmental, biological, pressure, and temperature sensors, or multisensing platforms post-processed, i.e., directly microfabricated, on their application-specific integrated circuit (ASIC).

BACKGROUND

MEMS devices are currently pervasively used in the automotive industry and consumer electronics. However, the market for standalone MEMS devices is starting to slow down due to the demand for integrated multi-usage elements, wherein multiple MEMS devices are integrated in a single platform. An example of such integration is multi-degree-of-freedom sensors where micromachined structures, such as accelerometers, gyroscopes and magnetometers are all integrated on the same package. This is to enable smaller form factors, lower cost and lower power consumption, thereby requiring single-die integration.

However, such single-die integration is typically achieved in a hybrid fashion, wherein the die containing the MEMS devices and the application-specific integrated circuit (ASIC), which drives the devices and outputs the signals, are individually fabricated and assembled to form the desired product. The cost associated with such an approach is usually high given that the integration has to be performed at the device level rather than at the wafer level. Moreover, the size tends to be large with a lot of wiring involved.

While there have been platforms, e.g., U.S. Pat. No. 7,104,129 B2, that enable wafer scale integration between the ASIC and the MEMS devices via multiple wafer bonding, the size (especially in the Z direction) still remains large. Moreover, the noise floor from the parasitic effects, which affects the device sensitivity, can still be high. As an example, in the case of capacitive-based sensors, such as commercial accelerometers and gyroscopes, the noise floor can be important due to the parasitic capacitances related to the metallic routings that can span through a whole wafer thickness. This requires additional design considerations at the device level to take this issue into account, which causes more power consumption and bulkier devices.

Such a bottleneck can be resolved by directly fabricating the MEMS elements on the CMOS ASIC substrate. However, silicon is the main material used for the MEMS elements, whose deposition is not compatible with the required thermal budget of the CMOS ASIC substrate, which cannot withstand any process temperatures higher than 450° C. The present invention provides wafer-scale integration in a monolithic fashion through the usage of MEMS structures whose structural material can be deposited directly on the ASIC interconnect layers at temperature lower than 450° C. The subsequent microfabrication steps define the MEMS elements which are anchored to the metal interconnects, thereby providing direct electrical contact. This single chip solution enables: (1) much easier routing to implement optimized mechanical structures, (2) an extremely low cost as no wafer bonding is required, (3) smaller form factors, (4) multiple MEMS elements on a single die, (5) much smaller parasitics providing low noise and higher performance.

SUMMARY

An assembly of metallic MEMS structures directly fabricated on planarized CMOS substrates, containing the application-specific integrated circuit (ASIC), by direct deposition and subsequent microfabrication steps on the ASIC interconnect layers, with integrated capping for packaging, is provided. The MEMS structures comprise at least one MEMS device element, with or without moveable parts anchored on the CMOS ASIC wafer with electrical contact provided via the metallic interconnects of the ASIC. The MEMS structures can also be made of metallic alloys, conductive oxides and amorphous semiconductors. The integrated capping, which provides a sealed cavity, is accomplished through bonding pads defined in the post-processing of the CMOS substrate. Moreover, the present invention provides wafer-scale processing steps for multi-device assemblies monolithically integrated with the CMOS at a much reduced cost.

DESCRIPTION OF THE EMBODIMENTS

Figure 1:
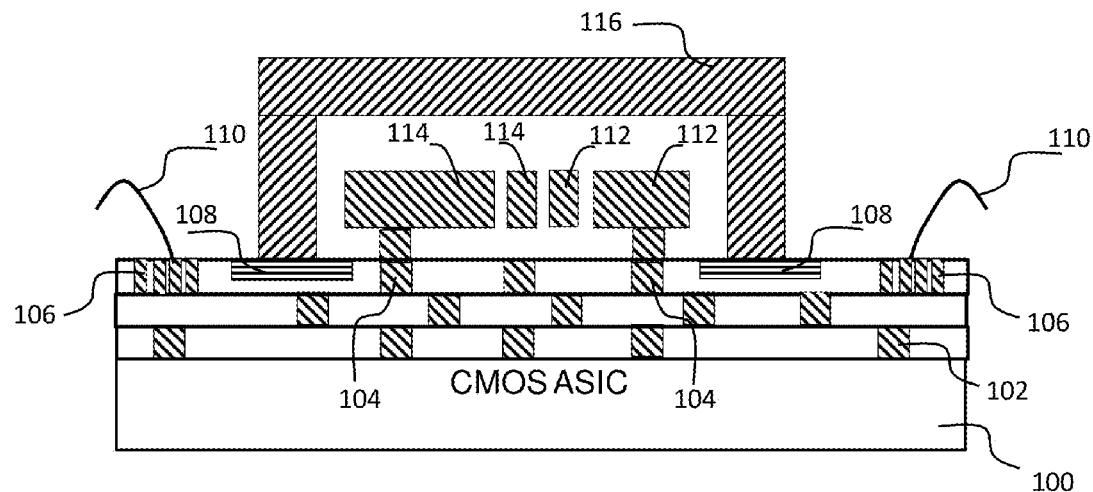
FIG. 1 shows, according to the embodiment of the present invention, a cross sectional view of several MEMS structures, with movable parts, post-processed, i.e., directly fabricated, using microfabrication techniques, on CMOS circuitry, containing the assembly application-specific integrated circuit (ASIC), in a monolithic fashion, i.e., by direct deposition and subsequent microfabrication steps on the ASIC interconnect layers, with integrated capping for packaging forming one cavity and with contact pads connect to bonding wires.

An assembly of metallic MEMS structures directly fabricated on planarized CMOS substrates, containing the application-specific integrated circuit (ASIC), is described. The MEMS structures can also be made of metallic alloys, conductive oxides and amorphous semiconductors. In the following description, numerous specific details are set forth, such as processing steps, in order to provide a thorough understanding of embodiments of the present invention. It will be apparent to one skilled in the art that embodiments of the present invention may be practiced without these specific details. In other instances, well-known features, such as integrated circuit design, are not described in detail in order to not unnecessarily obscure embodiments of the present invention. Furthermore, it is to be understood that the various embodiments shown in the Figures are illustrative representations and are not necessarily drawn to scale.

One or more embodiments are targeted towards monolithically CMOS-integrated sensors and actuators, and in particular inertial and magnetic field sensing without excluding environmental- and bio-sensing, and resonators using MEMS device elements. Embodiments may address approaches for providing compact multi-sensing and actuation platforms suitable to perform highly sensitive signal detection or actuation in a parallel fashion. Furthermore, one or more embodiments provide a cost effective and accurate system to enable wide applications of miniaturized sensors and actuators, as well as multi-sensing/actuation platforms for many industries, including consumer electronics, automotive and oil/gas industries. To provide context, conventional MEMS-based sensing technology, such as accelerometers and gyroscopes, is routinely used for motion sensing in smart phones, air-bag deployment systems, and more recently in wearable electronics and Internet of Things (IoT) applications. Such technology is usually based on stand-alone MEMS devices, which is starting to slow down due to the demand for integrated multi-usage elements, wherein multiple MEMS devices are integrated in a single platform. However, the total cost of such integration remains bulky, costly and power hungry, thereby restricting the use of such integrated technology. For a vulgarized usage, multi-sensing and actuation platforms need to be compact, sensitive and low power such that the overall cost is affordable.

One or more embodiments described herein are directed to the design and manufacturing of an assembly of MEMS structures post-processed, i.e., directly fabricated, on planarized CMOS substrates, containing the ASIC, by direct deposition and subsequent microfabrication steps on the ASIC interconnect layers. Such embodiments may be implemented to significantly improve the signal to noise ratio in sensing schemes, as parasitic effects are reduced greatly, enabling higher performances. This is while achieving easier routing to: (1) implement optimized mechanical structures, (2) enable an extremely low cost as low temperature wafer bonding is required only for capping, (3) enable smaller form factors, (4) multiple MEMS elements on a single die.

To provide further context, it is to be appreciated that a number of problems may be associated with existing integration platforms. First, these platforms require multi-substrate bonding at the die level with excessive wiring, engendering bulky and costly systems. Second, the excessive wiring engenders parasitics that affect the device performances (i.e., providing high noise) and increase power consumption. Past approaches (e.g., U.S. Pat. No. 7,104,129 B2) that enable wafer scale integration between the ASIC and the MEMS devices still use multiple wafer bonding, i.e., the size (especially in the Z direction) still remains large. Moreover, the noise floor from the parasitic effects can still be high due the metallic routings used. This requires additional design considerations at the device level to take this issue into account, which causes more power consumption and bulkier devices. In addition, the required recess on the CMOS ASIC wafer constrains further chip scaling.

In a first aspect, in accordance with an embodiment of the present invention, FIG. 1a shows a cross-sectional view of MEMS structures post-processed, i.e., directly fabricated on a planarized CMOS ASIC 100 substrate. The CMOS ASIC 100 specific to the MEMS device element assembly, which includes the various metallic interconnects, fabricated using standard microelectronics processes in any available commercial node. The metallic interconnects connect the ASIC from the first interconnect layer 102 to drive or record the signal from the MEMS structures 112 and 114 through the last interconnect layer 104. The interconnects are also routed towards the contact pads 110 to drive 112 and 114 or output the signal via wire-bonding 110 through external electrical connections. The structural material of the MEMS device elements can be selected from the group consisting of metals and metal alloys, conductive metal oxides and amorphous semiconductors including, but not limited to, Cu, Al, Ag, Ti, W, Au, Pt, Pd, Ru, Ni, Co, Cd, Pb, amorphous silicon, Cadium Zinc Telluride (CZT), $HfB_2$, $InO_3$, $SnO_2$, Indium Tin Oxide (ITO). The material can be deposited, at temperatures below 450 C using deposition techniques including, but not limited to, electroplating, electroless-plating, physical vapor deposition (such as sputtering, thermal and e-beam evaporation), chemical vapor deposition, atomic layer deposition, physical layer deposition.

A cap 116 is wafer-bonded to the CMOS ASIC 100 via bond-pads 108 directly fabricated on the CMOS ASIC on the last interconnect layer. The lateral and vertical dimensions of the cap 116 are defined by the range of motion of the MEMS structures 112 and 114 and should be large enough to allow them to move in-plane (i.e., laterally) or out-of-plane (i.e., vertically) with enough motion to perform their desired function. These dimensions are defined by lithography and subsequent microfabrication processes. In the case of out-of-plane motion, driving electrodes can also be fabricated and incorporated on the last interconnect layer. The MEMS structures 112 and 114 which define the device elements can be as many as possible, and can embody a single device, such as a sensor or an actuator, or as many devices as possible that embody a multi-sensing platform, a multi-actuation platform or a combination of both. As an example, MEMS structures 112 and 114 can be an accelerometer and a gyroscope directly fabricated on the CMOS ASIC substrate 100. Moreover, the MEMS structures 112 and 114 can have a thickness ranging from 0 to 300 micrometers.

Depending on the function of the MEMS elements, different pressure levels, within the cavity formed by the cap 116, are required to attain optimal operational conditions. While some require a high vacuum, e.g., capacitive-based gyroscopes with high quality factor and low noise, others require near atmospheric pressure, e.g., capacitive-based accelerometers in order to increase the squeeze-film damping effect that can prevent device overshoot and long settling times. Therefore, the cavity can be hermetically sealed at low pressures or maintained at elevated pressures using inert gases such as nitrogen, helium or argon, or dry air.

Figure 2:
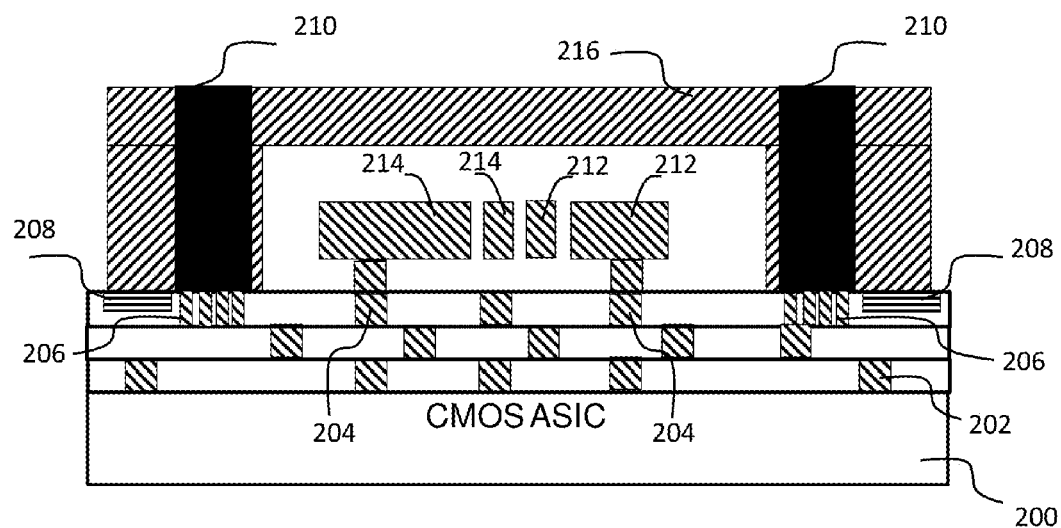
FIG. 2 shows, according to the embodiment of the present invention, a cross sectional view of several MEMS structures, with movable parts, post-processed on CMOS ASIC substrate, with integrated capping for packaging and through silicon vias (TSVs) connected to the contact pads.

FIG. 2 shows, in accordance with an embodiment of the present invention, the contact pads 210, to drive 212 and 214 or output the signal, connected to external electrical connections using through silicon vias (TSVs) 210, instead of wire bonding, in the cap 216. The TSVs can alternatively be in the CMOS ASIC substrate 200. Vertical feed-throughs can also be used in the cap 216.

Figure 3:
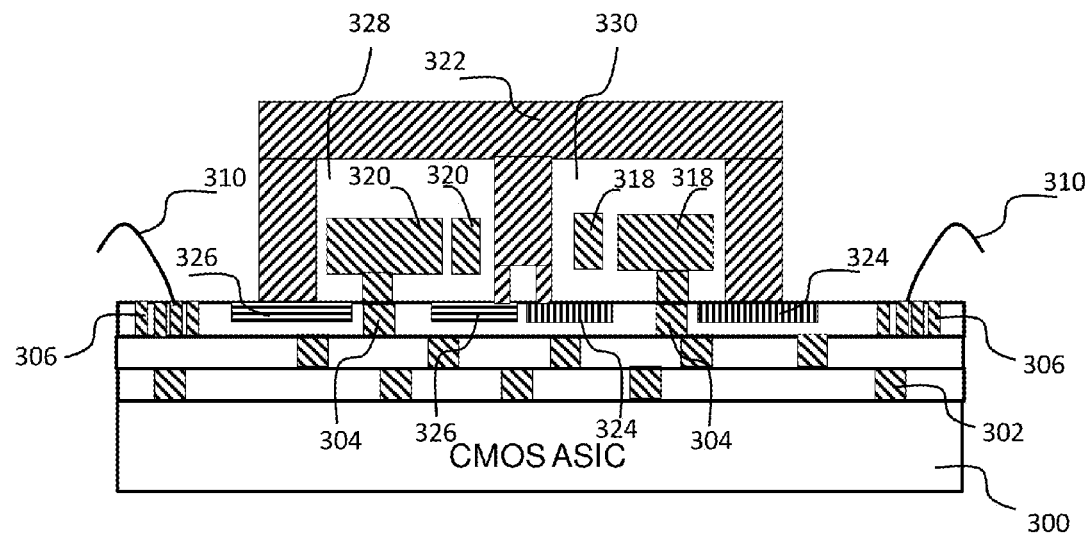
FIG. 3 shows, according to the embodiment of the present invention, a cross sectional view of several MEMS structures, with movable parts, post-processed on CMOS ASIC substrate, with integrated capping for packaging forming multiple cavities.

In the case where different device elements post-processed on the same CMOS ASIC substrate, require a different operational pressure, and in accordance with an embodiment of the present invention, numerous cavities with different pressures can be achieved. FIG. 3 shows a cross-sectional view of MEMS structures 318 and 320 post-processed on the CMOS ASIC substrate 300, each encapsulated within a different cavity 328 and 330 using a cap 322 lithographically defined to form separate chambers once fabricated and bonded to different bond-pads 324 and 326. A leak can be introduced in one of the cavities if an atmospheric pressure is required for one of the encapsulations. The number of the MEMS structures defining the device elements and the number of cavities can be higher than 2.

Figure 4:
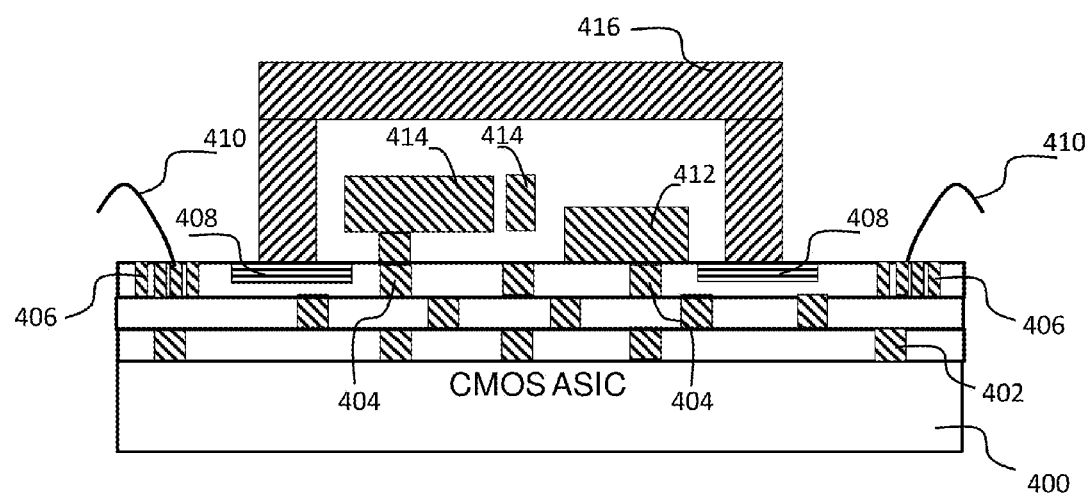
FIG. 4 shows, according to another embodiment of the present invention, a cross sectional view of MEMS structures, some with movable parts, and others without movable parts fully fixed on the CMOS ASIC substrate, post-processed on CMOS circuitry in a monolithic fashion, with integrated capping for packaging. There is no limitation to the number of MEMS structures.

FIG. 4 shows a cross-sectional view of a MEMS assembly, in which MEMS structures without (412) and with movable parts (414) are post-processed on a planarized CMOS ASIC 400 substrate, in accordance with another embodiment of the present invention. To provide further context, inertial sensors, such as accelerometers and gyroscopes, which are device elements with movable parts are integrated with compasses, such as magnetic tunneling junction or giant magnetoresistive magnetometers, which are usually devices without movable parts, are integrated on a single chip to form a 9-axis sensor combo. The structures without movable parts can also be embedded within the various interconnect layers. Note that compasses can also be based on Lorentz force magnetometers which do have movable parts.

Figure 5:
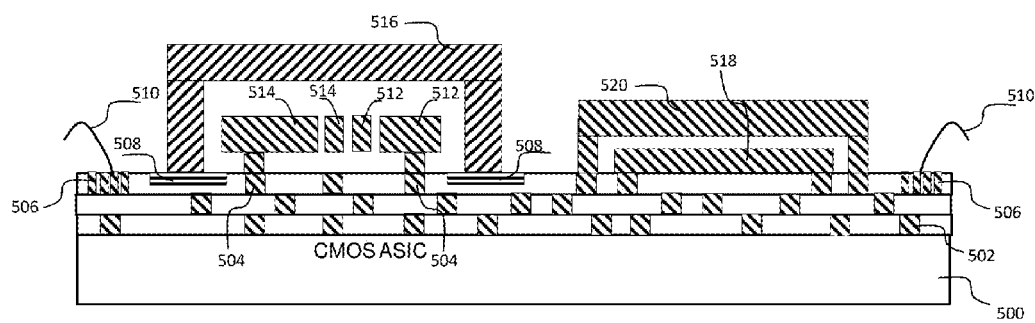
FIG. 5 shows, according to yet another embodiment of the present invention, a cross-sectional view of a MEMS assembly, in which some MEMS structures, with movable and non movable parts, require a gap maintained at a certain pressure (ambient or otherwise). Also included in the assembly other MEMS elements that do not require back access, but have a different operational processor, and thus require a cap.

In the case where some of the MEMS device elements post-processed on the same CMOS ASIC substrate, require ambient exposure, i.e., without a cap, but with a gap between two structures which is maintained at a certain pressure (ambient or otherwise), and in accordance with yet another embodiment of the present invention, the cap is lithographically defined to cover only the MEMS device elements that require it. FIG. 5 shows a cross-sectional view of such a MEMS assembly, in which MEMS structures, with a non movable part 518 and a movable part 520, that require a gap maintained at a certain pressure (ambient or otherwise), are post-processed on a planarized CMOS ASIC 500 substrate, but without a cap. These structures are directly connected to the metal interconnects 504 which drive or output the signal. To provide further context, MEMS-based capacitive pressure sensors require such a geometry, wherein a membrane (movable electrode) deforms upon a pressure application, which reduces the gap between the membrane and a closely placed electrode. The reduced gap can be sensed through the capacitance change between the two electrodes. Also included in the assembly other MEMS elements 512 and 514 that require a different operational pressure, and thus require a cap 516 which is bonded to the CMOS ASIC 500 substrate via bond pads 508. Contact pads 506 to externally drive the various structures or output the signals via bonding wires 510, are also included. These bonding wires can also be replaced by TSVs in the CMOS ASIC substrate 500 or the cap 516. Vertical feed-throughs can also be used in the cap 516.

Figure 6:
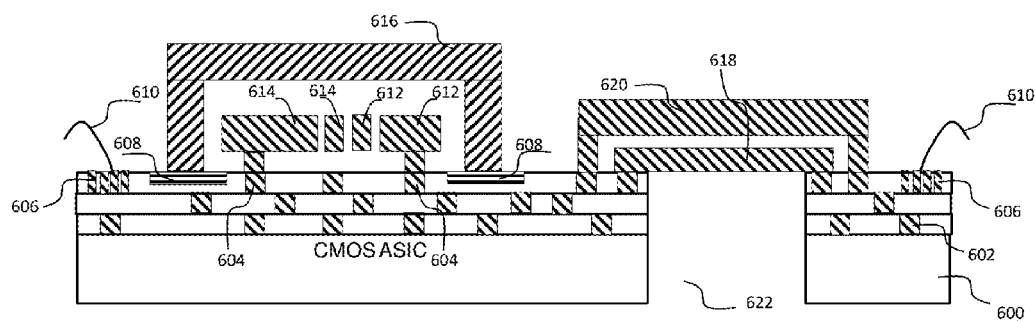
FIG. 6 shows, according to yet another embodiment of the present invention, a cross-sectional view of a MEMS assembly, in which some MEMS structures, with movable and non movable parts, require a back access on the planarized CMOS ASIC substrate, that are also directly connected to the metal interconnects to drive or output the signal. Also included in the assembly other MEMS elements that do not require back access, but have a different operational processor, and thus require a cap.

In the case where some of device elements post-processed on the same CMOS ASIC substrate, require a back access in the CMOS ASIC substrate for their operation, and in accordance with yet another embodiment of the present invention, part of the CMOS ASIC substrate can be etched through the whole thickness to provide such access. FIG. 6 shows a cross-sectional view of such a MEMS assembly, in which MEMS structures with a movable part 618 and a non movable part 620 that require such a back access 622 are post-processed on a planarized CMOS ASIC 600 substrate. These structures are directly connected to the metal interconnects 604 which drive or output the signal. The non movable part 620 can also include holes etched through its thickness. To provide further context, MEMS-based capacitive pressure sensors and microphones require, under certain variant geometries, such a back access for their operation, wherein a membrane deforms upon a pressure application, which reduces the gap between the membrane (bottom electrode) and a closely placed (top) electrode. The reduced gap can be sensed through the capacitance change between the two electrodes. Also included in the assembly and similar to FIG. 5, other MEMS elements 612 and 614 that do not require back access, but have a different operational processor, and thus require a cap 616 which is bonded to the CMOS ASIC 600 substrate via bond pads 608.

Figure 7:
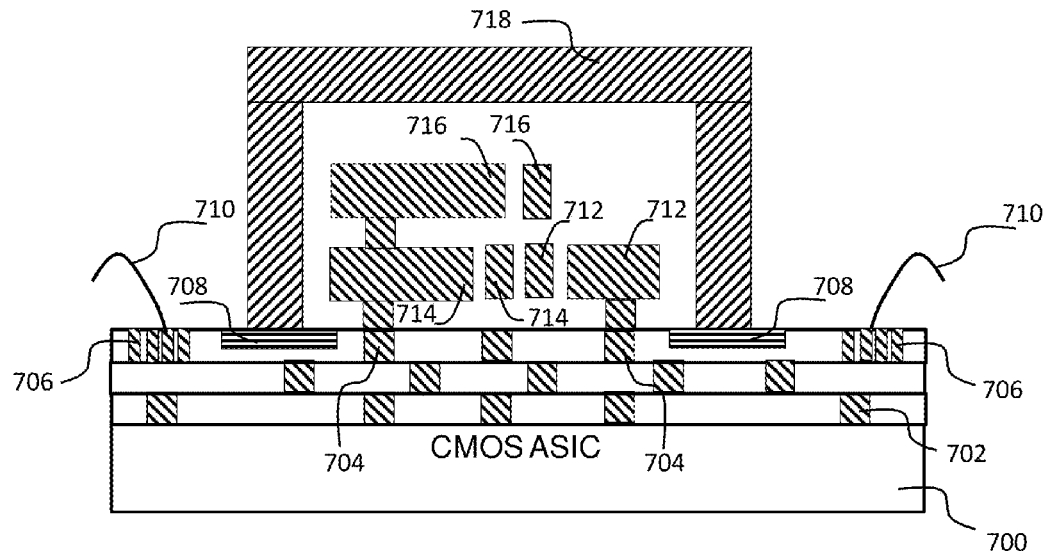
FIG. 7 shows, according to yet another embodiment of the present invention, a cross sectional view of multiple layers of MEMS structures sharing the same interconnect connections, thereby forming a 3D assembly of MEMS structures on ASIC in a monolithic fashion.

FIG. 7 shows a cross-sectional view of a MEMS assembly, in which MEMS structures 716 are fabricated, in accordance with yet another embodiment of the present invention, on top of MEMS structures 714 by repeating the fabrication steps vertically to build multiple layers of MEMS structures, whereby each MEMS layer has a different geometrical shape, while other MEMS structures 712 can have a single layer. The number of vertical structures within the cavity can be larger than two structures defining multiple device elements in the lateral and vertical directions, thereby enabling 3D assembly of MEMS structures on CMOS ASIC substrate 700 in a monolithic fashion.

Figure 8:
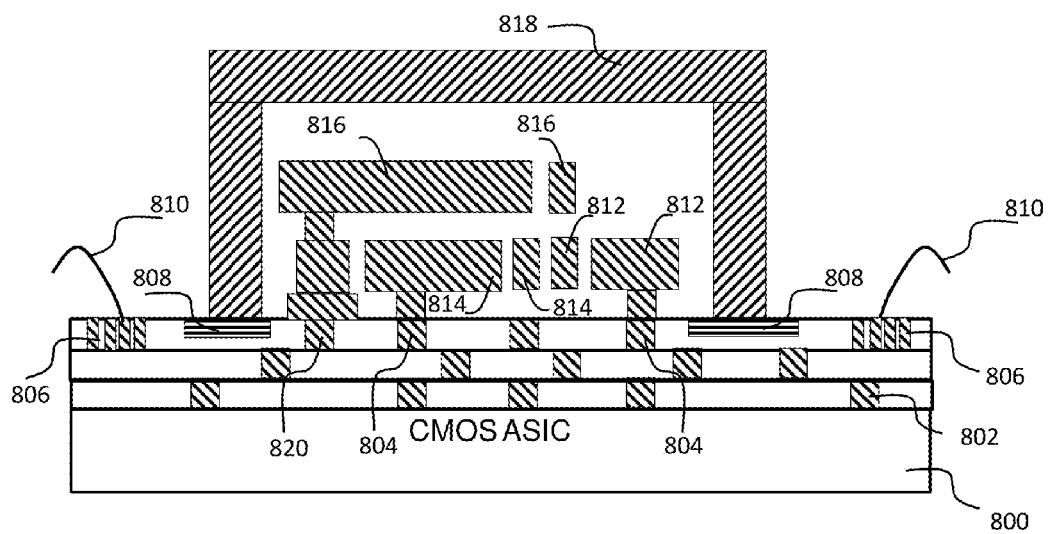
FIG. 8 shows, according to yet an embodiment of the present invention, a cross sectional view of multiple layers of MEMS structures not sharing the same interconnect connections, and forming a 3D assembly of MEMS structures on ASIC in a monolithic fashion.

FIG. 8 shows a cross-sectional view of a MEMS assembly, in which MEMS structures 816 are stacked, in accordance with yet another embodiment of the present invention, on top of MEMS structures 814 by repeating the fabrication steps vertically to build multiple layers of MEMS structures, but with individual, i.e., without sharing, interconnect connections 804 and 820 to drive the structures 814 and 816 or output the signal. The MEMS structures 814 and 816 have a different geometrical shape, while other MEMS structures 812 can have a single layer.

Figure 9:
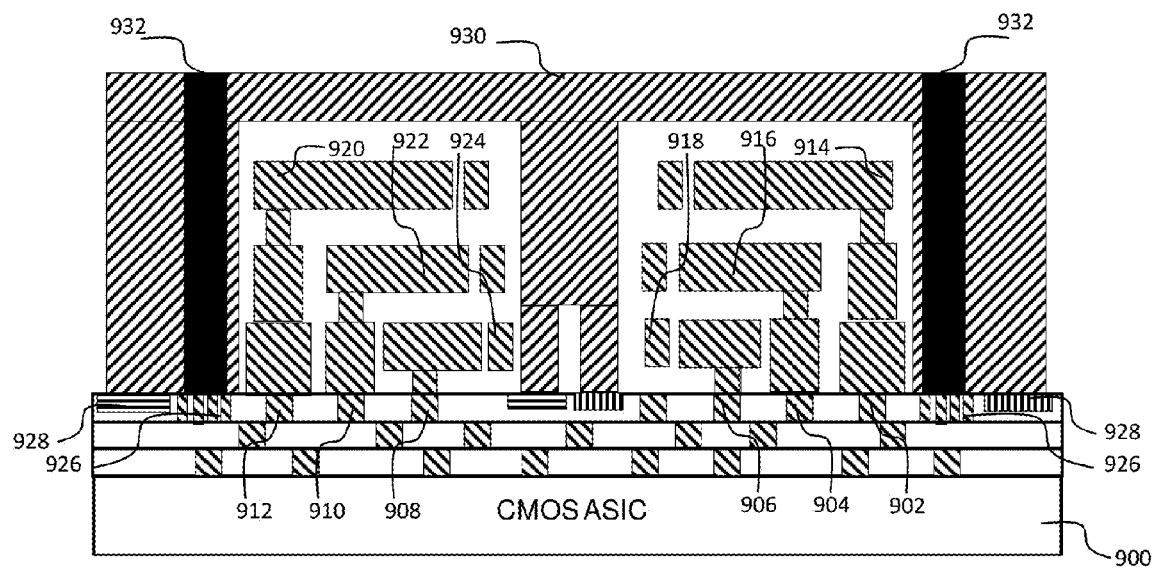
FIG. 9 shows, according to yet an embodiment of the present invention, a cross-sectional view of a MEMS assembly, in which two sets of MEMS structures are stacked on top of each other, in with individual interconnect connections. Each set requires a different operational pressure and is thus encapsulated by a two-cavity cap bonded to the CMOS ASIC substrate.

FIG. 9 shows a cross-sectional view of a MEMS assembly, in which two sets of MEMS structures 914 through 924 are stacked on top of each other, in accordance with yet another embodiment of the present invention, with individual interconnect connections 902 through 912 to drive these structures or output the signal. This is achieved by repeating the fabrication steps vertically to build multiple layers of MEMS structures. Each set requires a different operational pressure and is thus encapsulated by a two-cavity cap 930, bonded to the CMOS ASIC substrate 900 via bonding pads 928, wherein each cavity is maintained at a different pressure. The contact pads 926, to drive or output the signal, are connected to external electrical connections using through silicon vias (TSVs) 932. The TSVs can alternatively be in the CMOS ASIC substrate 900. Vertical feed-throughs can also be used in the cap 930. To provide further context, one set of MEMS structures could correspond to accelerometers, whereas the other one could correspond to gyroscopes, with each element sensing one direction, x, y or z. This vertical stacking enables very small footprint. The number of MEMS structures and cavities can be larger than 2.

Figure 10:
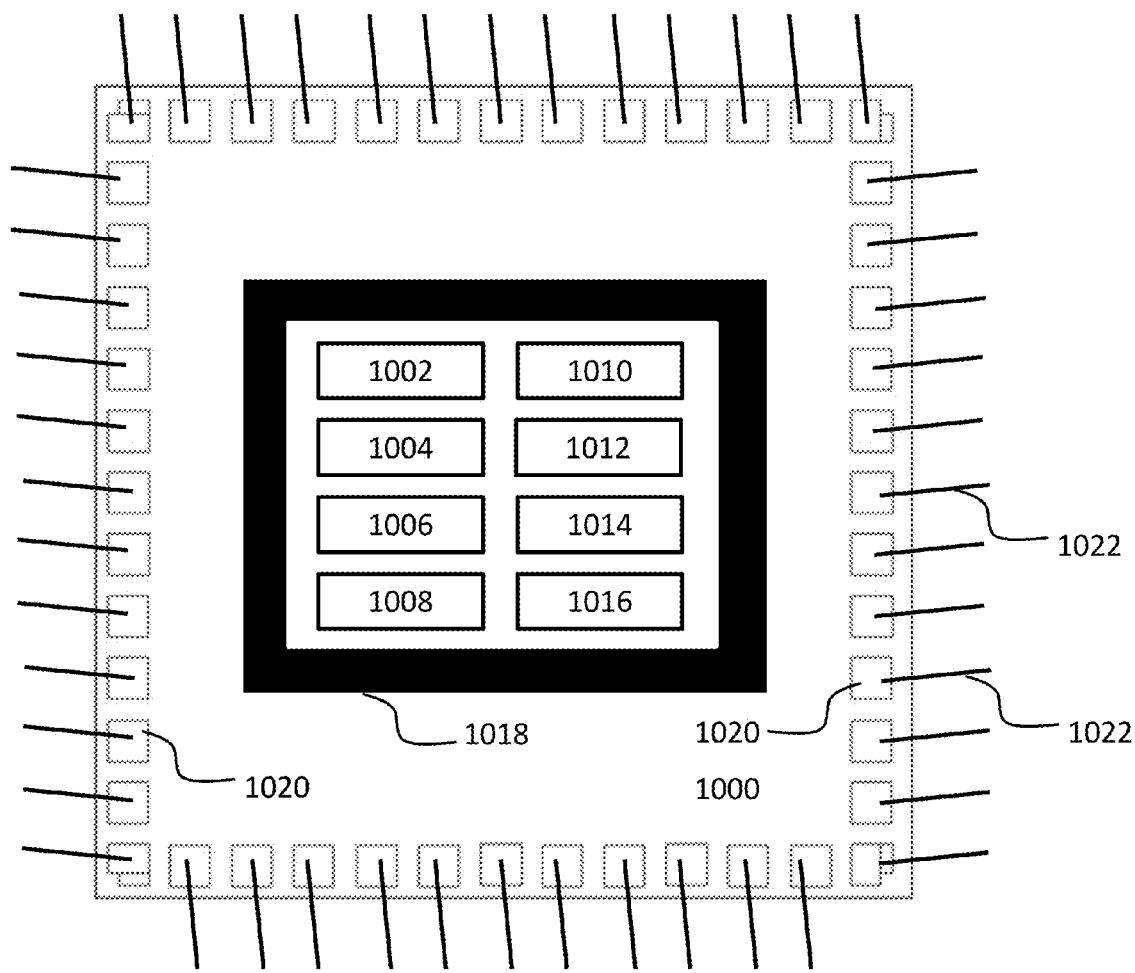
FIG. 10 shows a top view of the complete assembly containing multiple MEMS device elements capped within a cavity and post-processed directly on the CMOS ASIC substrate with bonding wires bonded to the ASIC pads, according to an embodiment of the present invention. Through silicon vias (TSVs) in the CMOS ASIC substrate or the cap, as well as vertical feed-throughs in the cap, can also be used instead of wire bonding.

FIG. 10 shows a top view of the full assembly that could correspond to the various variations described in the cross-sectional views of FIGS. 1 through 9, in which multiple device elements 1002, 1004, 1006, 1008, 1010, 1012, 1014 and 1016 are post-processed on the CMOS ASIC substrate 1000. The standoff of the cap 1018 is continuous and is bonded to the continuous bonding pad on the CMOS ASIC substrate 1000, to provide complete encapsulation of the device elements 1002, 1004, 1006, 1008, 1010, 1012, 1014 and 1016. As mentioned above, the cavity can be hermetically or non-hermetically sealed. Moreover, multiple encapsulations of various device elements can be achieved by lithographically defining multiple cavities within the cap, each with a different seal kind to satisfy the device element functionality. The bonding pad can also be routed to the ground through the metallic interconnects of the CMOS ASIC substrate. To provide the external electrical contact through the wire-bonding 1022, or TSVs in the CMOS ASIC substrate or the cap, as well as vertical feed-throughs in the cap, the contact pads 1020 at the periphery of the chip are also routed through the metallic interconnects to drive the mechanical structures or detect the sensing signal outside of the cavity without excessive wiring.

Figure 11:
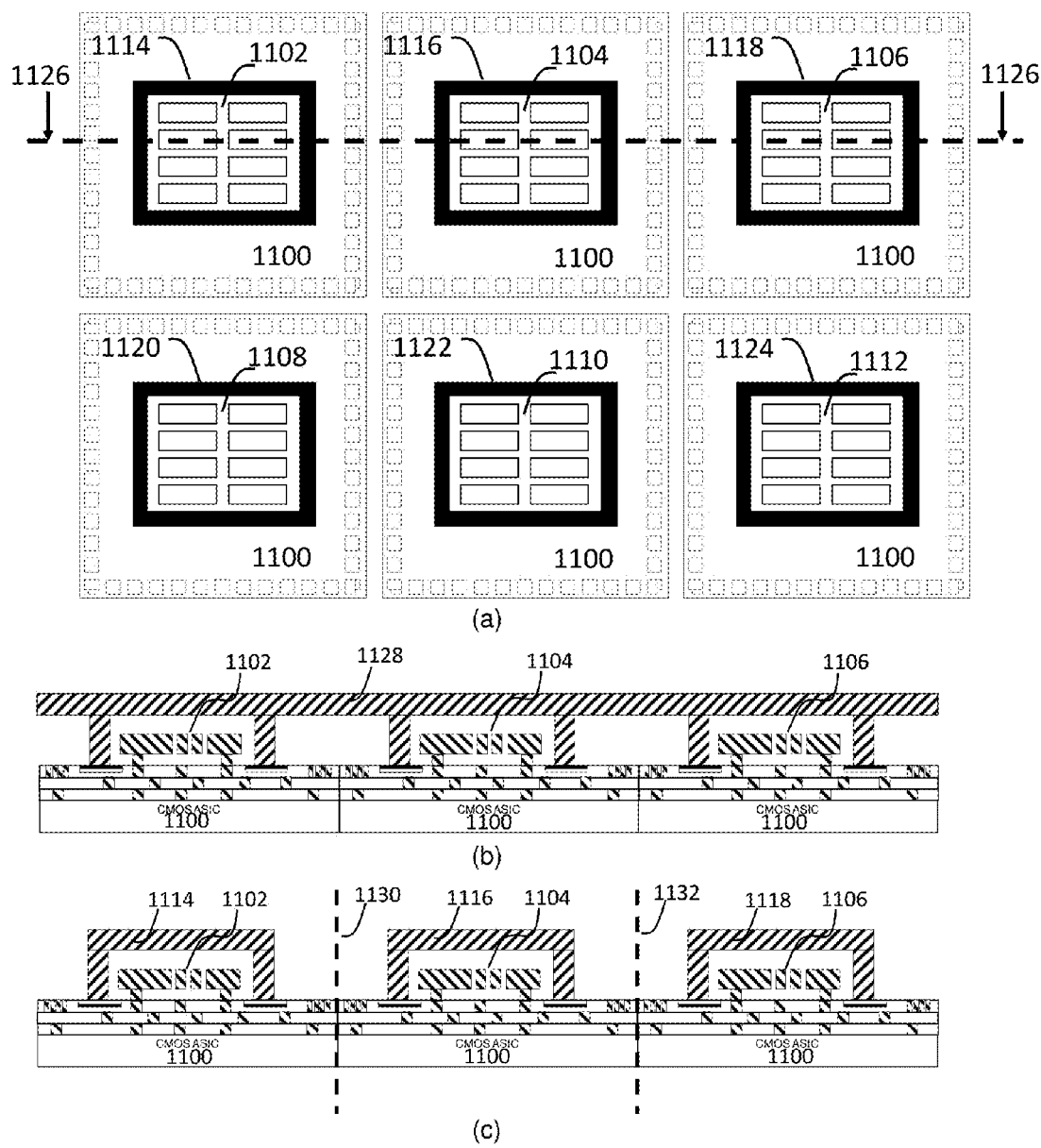
FIG. 11 shows (a) a top view of a wafer scale of the MEMS assembly before dicing of individual devices according to a further embodiment of the present invention, (b) a cross-sectional view of the wafer scale MEMS assembly in (a) prior to the final etch of the cap and the finalization of individual devices, and (c) a cross-sectional view of the wafer scale MEMS assembly in (a), i.e., after the final etch of the cap and the finalization of individual devices.

FIG. 11*a* shows a top view of a wafer scale of a monolithically CMOS-integrated MEMS assembly according to a further embodiment of the present invention. Multiple caps 1114, 1116, 1118, 1120, 1122 and 1124, in which multiple MEMS device element groups 1102, 1104, 1106, 1108, 1110 and 1112, post-processed on the same wafer-scale CMOS ASIC substrate, are encapsulated. The current embodiment of the present invention can be expanded to any number of MEMS device element groups. FIG. 11*b* shows a cross sectional view of the wafer scale assembly of FIG. 11*a* along the 1126 line prior to the last processing step that defines the individual capping per die and exposes the contact pads to the external electrical contact. As shown in FIG. 11*b*, the bonding of the cap 1128 is performed at the wafer scale on the CMOS ASIC substrate, containing the post-processed MEMS assembly, via the bonding pads. The cap standoff dimensions are defined by the lateral and vertical motions of the MEMS structures as defined by their functionalities. Once the bonding performed, the cap 1128 is then further processed through lithography and etching (e.g., reactive ion etching), or grinding, to define the individual caps, 1114, 1116 and 1118, at the die level, as sown in FIG. 11*c*. The full wafer scale assembly can then be diced along the 1130 and 1132 lines to form individual dies. This embodiment not only provides wafer scale processing that enables a significant cost reduction, as opposed to bonding at the individual device level without any needed external packaging, but also, and because the cap is away from the die periphery, provides significant protection to the MEMS device elements during the dicing process, thereby increasing yield. Thus, embodiments described herein can provide a scalable and monolithically CMOS-integratable sensors and actuators in a very cost effective fashion.

In accordance with an embodiment of the present invention, a new fabrication process is described for post-processing the MEMS structures on the CMOS ASIC substrate.

The resulting fabricated structures, with or without movable parts, may be utilized for sensing and actuation. More generally, one or more embodiments described herein provide a unique combination of using MEMS device elements monolithically integrated on their respective CMOS ASIC for sensing and actuation.

Referring to FIG. 12a, a CMOS ASIC 1200, specific to the MEMS device elements to be post-processed, which includes the various metallic interconnects, is fabricated using standard microelectronics processes in any available commercial node. The metallic interconnects connect the ASIC to the MEMS structures to drive or record the signal. They are also routed towards the contact pads to drive or output the signal via wire-bonding, or TSVs in the ASIC substrate or the cap, as well as vertical feed-throughs in the cap, through external electrical connections. The last interconnect layer also includes the cap bonding-pads that could be routed to the ground connection.

Figure 12:
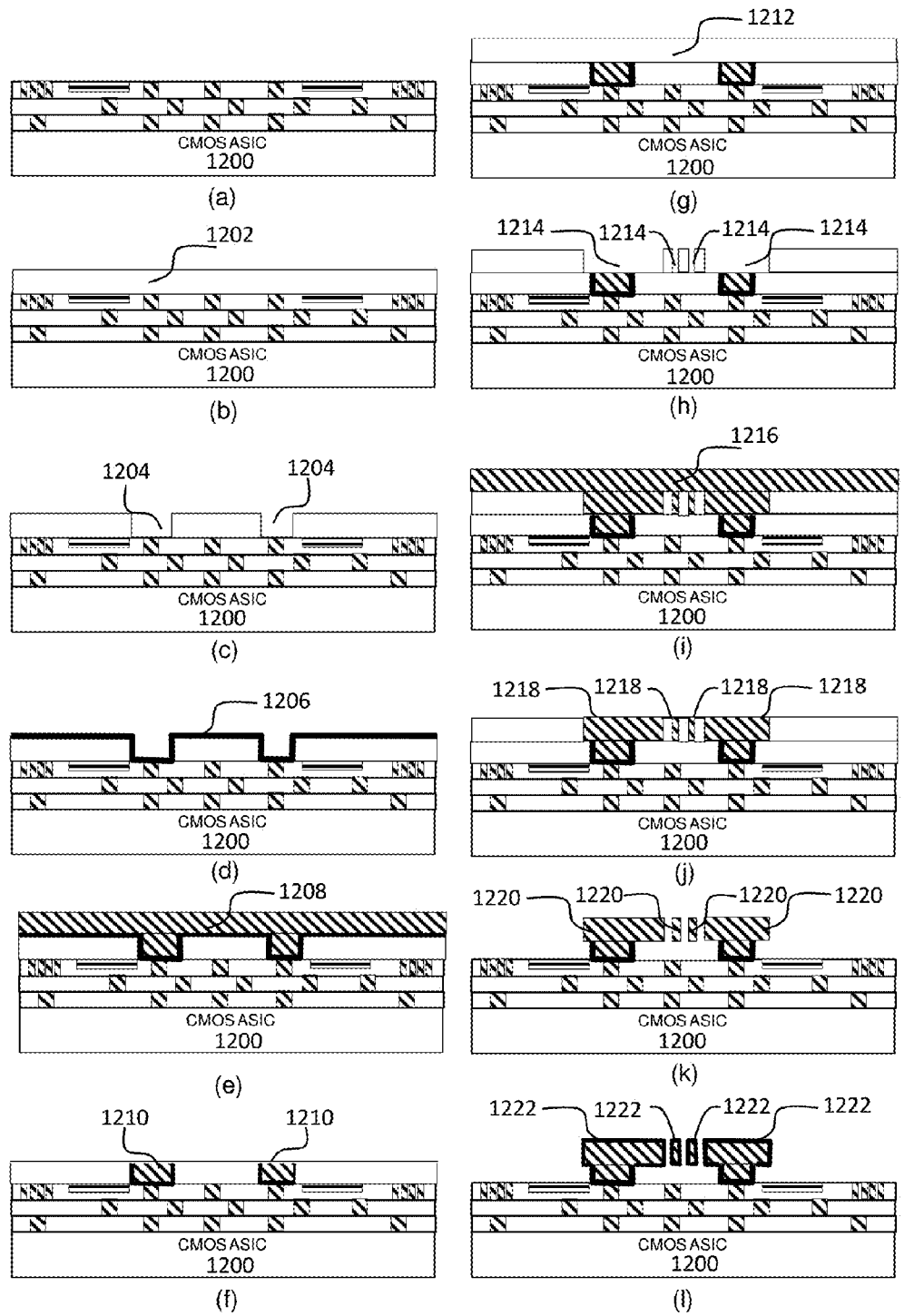
FIGS. 12a through 12l show one of the preferred post-processing i.e., direct fabrication, on the CMOS ASIC substrate by direct processing steps on the ASIC interconnect layers, according to an embodiment of the present invention.

Referring to FIG. 12b, a mold layer 1202, also referred to as a sacrificial layer, is deposited on the last interconnect layer. The mold layer consists of commonly used materials in IC interconnects and packaging including, but not limited to, $SiO_2$, SiNx, tetraethyl orthosilicate (TEOS), a low-k dielectric, such as F-, C- and H-doped $SiO_2$, xerogels and aerogels, an organic film, such as photoresist, including SU-8, polyimides, aromatic polymers, parylene, amorphous carbon, Teflon/PTFE, Ajinomoto build-up film (ABF), or a combination of all. The layer, as shown in FIG. 12c, is then patterned using lithography and (dry/wet) etching to open up windows 1204 down to the metallic interconnect on which the MEMS structures will be anchored, which will also provide electrical contact. In the case of MEMS structures whose structural material can corrode, such as, but not limited to, Cu, W, Ti, a protective layer can be deposited. This layer can also act as a diffusion barrier to these structural materials. In the fabrication process shown in FIG. 12, the protective layer 1206, which should be conductive, is conformally deposited on the surface, as shown in FIG. 12d. An example of such a layer could consist, but is not limited to, TiN, TaN, AlN, Pt, Ru, Ta, $In_2O_3$, $SnO_2$, or Indium-Tin-Oxide (ITO). This can be accomplished using atomic layer deposition (ALD), chemical vapor deposition (CVD), or physical vapor deposition (PVD) as in the case of sputtering. The thickness of this layer can range from 0 to 1000 nanometers.

Referring to FIG. 12e, the structural material 1208, which will form the anchor part of the MEMS structures once patterned, is deposited. In the fabrication process shown in FIG. 12, the film 1208 is deposited using electroplating, electroless-plating, or low temperature CVD, and is thus limited to materials that can be electroplated or electroless-plated, including, but not limited to, Cu, Al, Ag, Au, Pt, and W. The plating process requires a deposition of a seed layer using PVD, CVD or ALD, followed by the plating process, which are all performed at temperatures below 450° C. In some embodiments, an adhesion layer such as chromium, titanium, tantalum, or various other adhesion layers may be utilized to improve bonding between the film 1208 and the metallic interconnects. The structural material 1208 is then planarized down to the mold layer, i.e., the protective film 1206 at the surface could also be polished, to form the anchor structures 1210 using chemical mechanical polishing (CMP), as shown in FIG. 12f.

The process steps of FIGS. 12b through 12f are repeated again as shown in FIGS. 12g through 12j with different lithographic masks used in FIG. 12h to define the free standing parts of the MEMS structures. Note that, although not shown here, an etch-stop layer can be deposited and patterned by etching or lift-off right before the deposition of the second mold layer 1212. This layer can also act as a copper diffusion barrier. The mold layer is then (wet/dry) etched away to form the free standing MEMS structures 1220, as shown in FIG. 12k. Finally, a final protective film 1222 can be deposited (FIG. 12l). For this last step, the protective film 1222 does not have to be conductive, but should be conformally deposited. Besides the materials mentioned above, the film material can include, but not limited to, metal oxides such as $Ta_2O_5$, $In_2O_3$, $SnO_2$, ITO, $TiO_2$, $SiO_2$, $Y_2O_3$, $Al_2O_3$, $HfO_2$, $ZrO_2$, $ZrSiO_4$, $BaTiO_3$, $BaZrO_3$, Teflon, or other organic materials. This can be accomplished using atomic layer deposition (ALD), chemical vapor deposition (CVD), or physical vapor deposition (PVD) as in the case of sputtering. The thickness of this layer can range from 0 to 1000 nanometers.

In the case the MEMS elements require a back access within the CMOS ASIC substrate 1200 as in FIG. 5, further lithography and etching steps can be added to the process steps of FIG. 12. The back access or etch of the CMOS ASIC substrate 1200 can be performed using methods such as, but not limited to, deep reactive ion etching, reactive ion etching, or wet etching in KOH or TMAH-based solutions.

Figure 13:
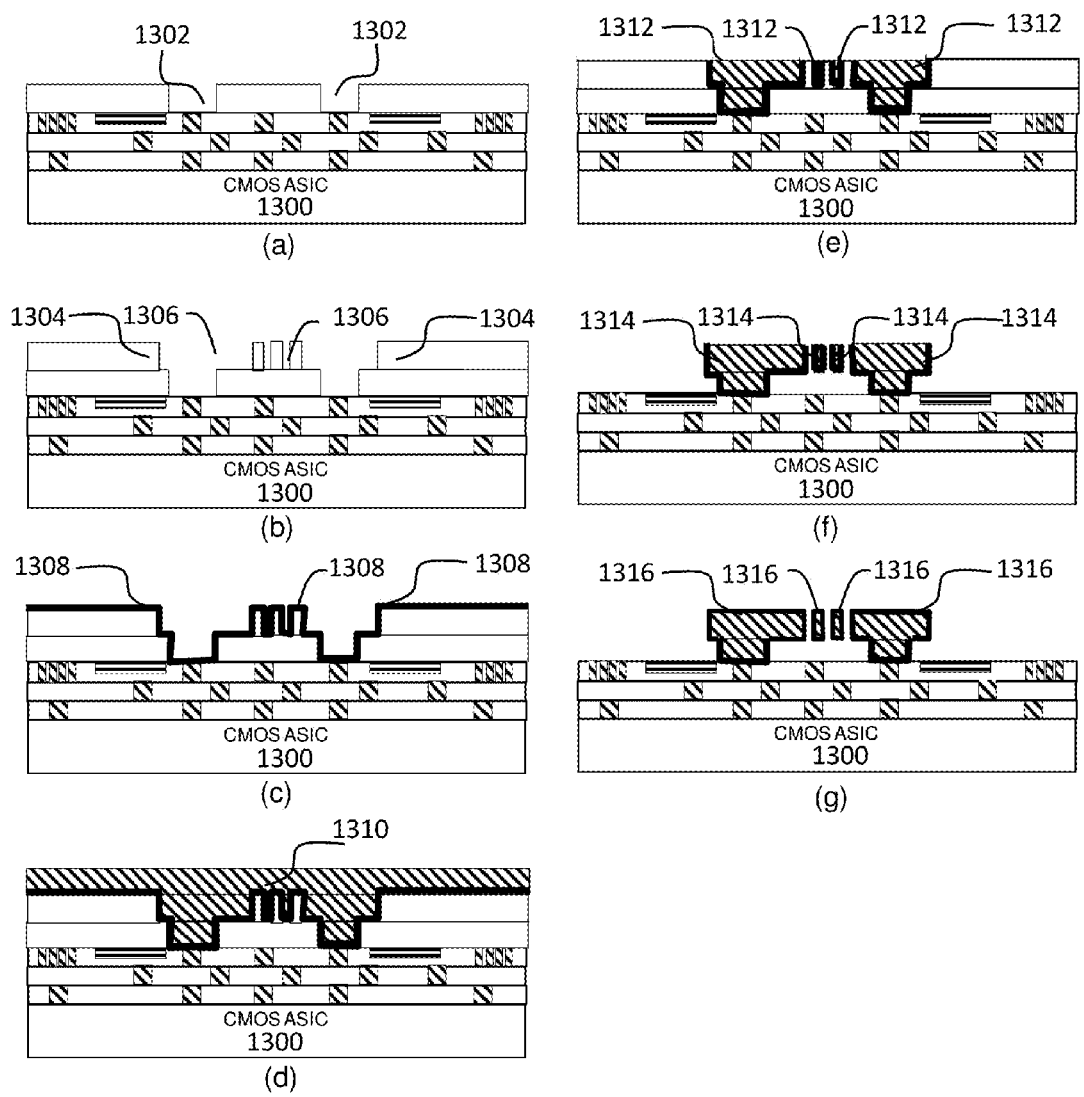
FIGS. 13a through 13g show another preferred post-processing i.e., direct fabrication, on the CMOS ASIC substrate by direct processing steps on the ASIC interconnect layers, according to an embodiment of the present invention.

It is to be appreciated that other process fabrication schemes can also be pursued as shown in FIG. 13. For example, the deposition and patterning of the mold layer 1302, is followed by the deposition and patterning of an etch-stop layer for the mold, as shown in FIG. 13a. This is then, followed by the deposition of the second mold layer 1304 and its patterning 1306, as shown in FIG. 13b. Only then the protective film 1308 is deposited conformally as described previously, followed by the electroplating, electroless-plating, PVD or CVD deposition, of the structural film 1310, which is then planarized using CMP to form the MEMS structures 1312. These steps are shown in FIGS. 13c through e. The mold layer is then (wet/dry) etched away to form the free standing MEMS structures 1314, and the final protective film 1316 is deposited, as shown in FIGS. 13f and g.

Figure 14:
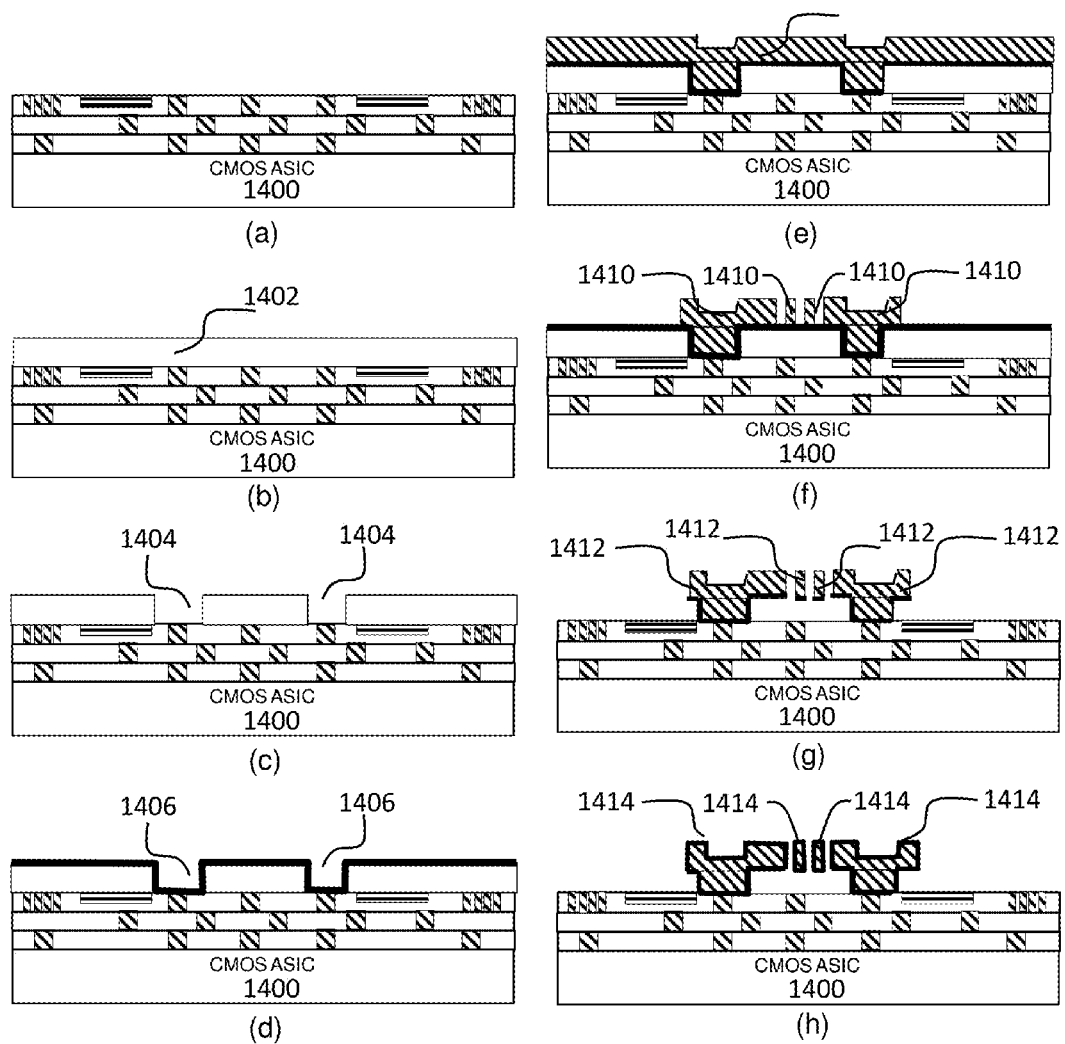
FIGS. 14a through 14h show yet another preferred post-processing, i.e., direct fabrication, on the CMOS ASIC substrate by direct processing steps on the ASIC interconnect layers, according to an embodiment of the present invention.

In accordance with another embodiment of the present invention, another fabrication process is described for post-processing the MEMS structures on the CMOS ASIC substrate 1400 (FIG. 14a), which can enable the use of other materials that cannot be plated, such as low temperature amorphous silicon. In this case, a sacrificial layer 1402 is deposited and then patterned to open up the access to the interconnects 1404, as shown in FIGS. 14b and C. This is followed by the conformal deposition of the conformal protective film 1406 as described above, as shown in FIG. 14d. The structural material 1408 is then deposited using techniques such as PVD, CVD or PLD, which is subsequently patterned by etching to yield the desired MEMS structures. These steps are shown in FIGS. 14e and f. A lift-off technique, wherein a resist is first lithographically patterned, followed by a direct deposition of the structural material, and the lift-off of the resist, can also be used to yield the same MEMS structures. Finally, the sacrificial layer is (wet/dry) etched away to form the free standing MEMS structures 1412, followed by the deposition of the final protective film 1414, as shown in FIGS. 14g and h.

Figure 15:
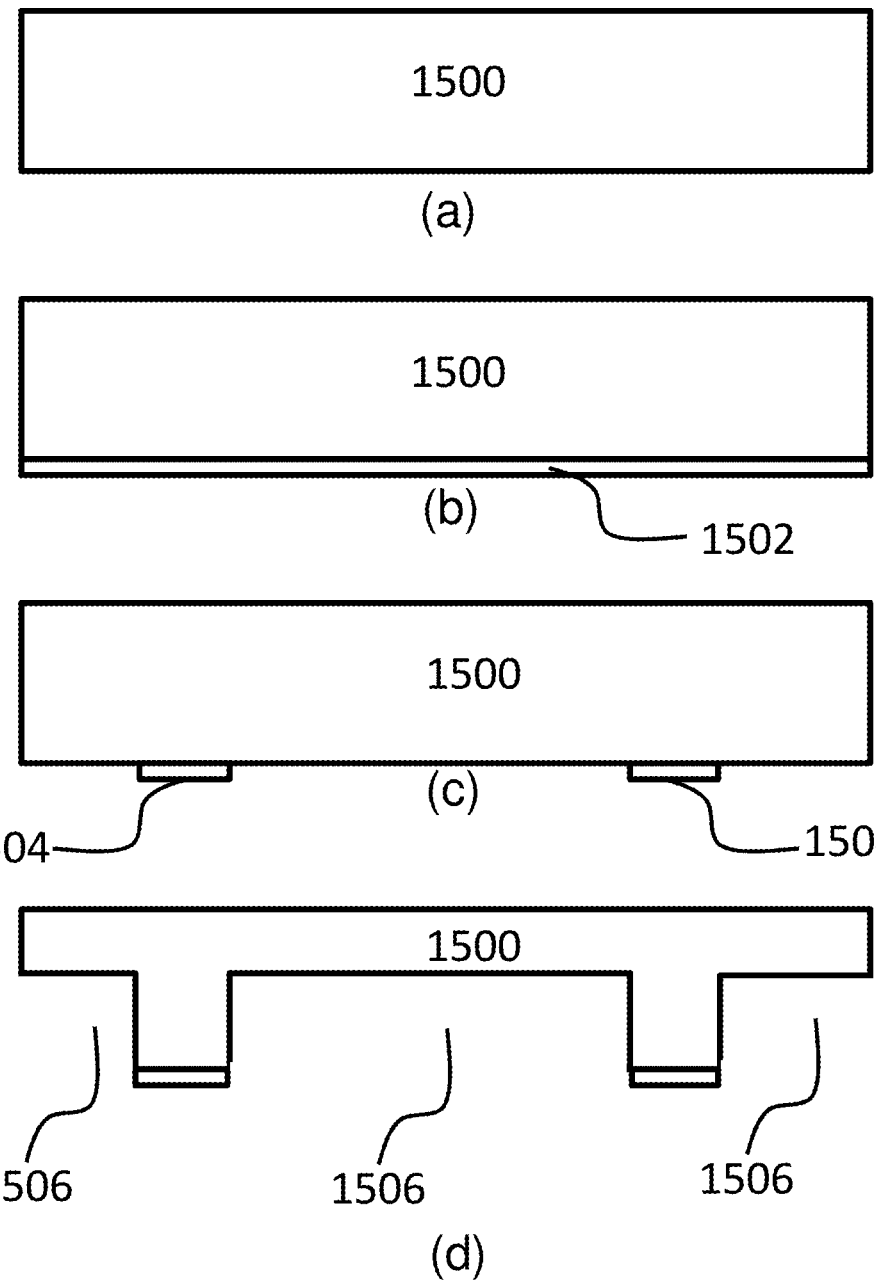
FIGS. 15a through 15d show preferred processing steps of a cap wafer according to an embodiment of the present invention.

FIGS. 15a through d show the fabrication steps of the wafer-scale cap, such as cap 116 shown in FIG. 1. A wafer 1500, which could be made of various materials, including, but not limited to, silicon (Si), copper, quartz, or sapphire, is used as a starting material for the cap, as shown in FIG. 15a. FIG. 15b shows the film 1502, which could be a dielectric or a metal. In case of a dielectric, film 1502 can be deposited, or grown as in the case of thermal silicon oxide on silicon, on the wafer 1500 surface and can be made of $SiO_2$ or $SiN_x$ deposited via PVD or CVD processes. In the case of a metal, film 1502 can also be deposited using PVD, such as sputtering or evaporation, CVD, or plating processes. Film 1502 is then patterned through lithography and etching (or lift-off in the metal case) to provide the patterned film 1504, which not only serves as a mask during the subsequent etch of the wafer 1500 to form the cap recess 1506, but also an insulator, in the case of a dielectric, during the subsequent bonding to the CMOS ASIC wafer. In the case of a metal, film 1502 provides a connection to the cap, which can be grounded by routing the bonding pad, through the interconnect layers, to ground. These steps are shown in FIGS. 15 *c* and *d*.

It is to be appreciated that the cap can be further processed to form through-thickness holes that would be filled with TSVs to form a structure similar to FIG. 2. The TSVs would then be aligned and in contact with the contact pads of the CMOS ASIC substrate after the final bonding.

Figure 16:
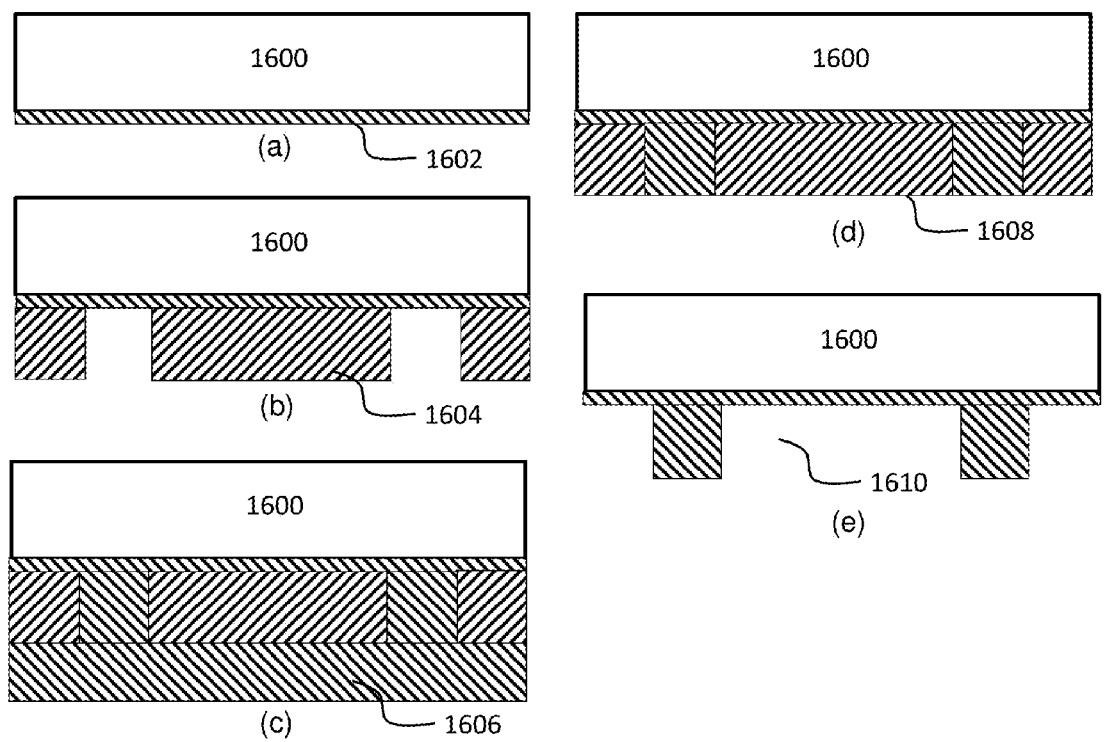
FIGS. 16a through 16e show another preferred processing of a cap wafer, whose structural material is a metal, according to an embodiment of the present invention.

It is to be also appreciated that other process fabrication schemes for the cap can also be pursued, especially when the main capping material is deposited using PVD, CVD, electro- or electroless-plating, as shown in FIG. 16. In this case and as shown in FIG. 16*a*, a first layer of the cap material 1602 can be deposited on the starting material 1600, which can be, but not limited to, a silicon wafer. In some embodiments, an adhesion layer such as chromium, titanium, tantalum, or various other adhesion layers may be utilized to improve bonding between the cap material 1602 and the substrate material 1600. A mold material 1604 is then deposited using PVD, CVD or spin coating processes and patterned with a negative image of the final cap using process steps similar to FIG. 15, as shown in FIG. 16*b*. Another layer of the cap material 1606 is then deposited, as shown in FIG. 16*c*. It is to be appreciated that in the case the cap material can corrode, such as, but not limited to, Cu, W, Ti, a protective layer can be deposited. This layer can also act as a diffusion barrier to these structural materials. An example of such a layer could consist, but is not limited to, TiN, TaN, AlN, Pt, Ru, Ta, $In_2O_3$, $SnO_2$, or ITO. This can be accomplished using ALD, CVD, or PVD as in the case of sputtering. The thickness of this layer can range from 0 to 1000 nanometers. It is also to be appreciated that a seed layer might be needed in the case of a plating process, which can be deposited using PVD or CVD processes. The cap material 1608 is then planarized down to the substrate layer using chemical mechanical polishing (CMP), as shown in FIG. 16*d*. This is followed by etching the mold layer 1610, as shown in FIG. 16*e*. The starting material can either be etched away or kept for further structural rigidity.

Figure 17:
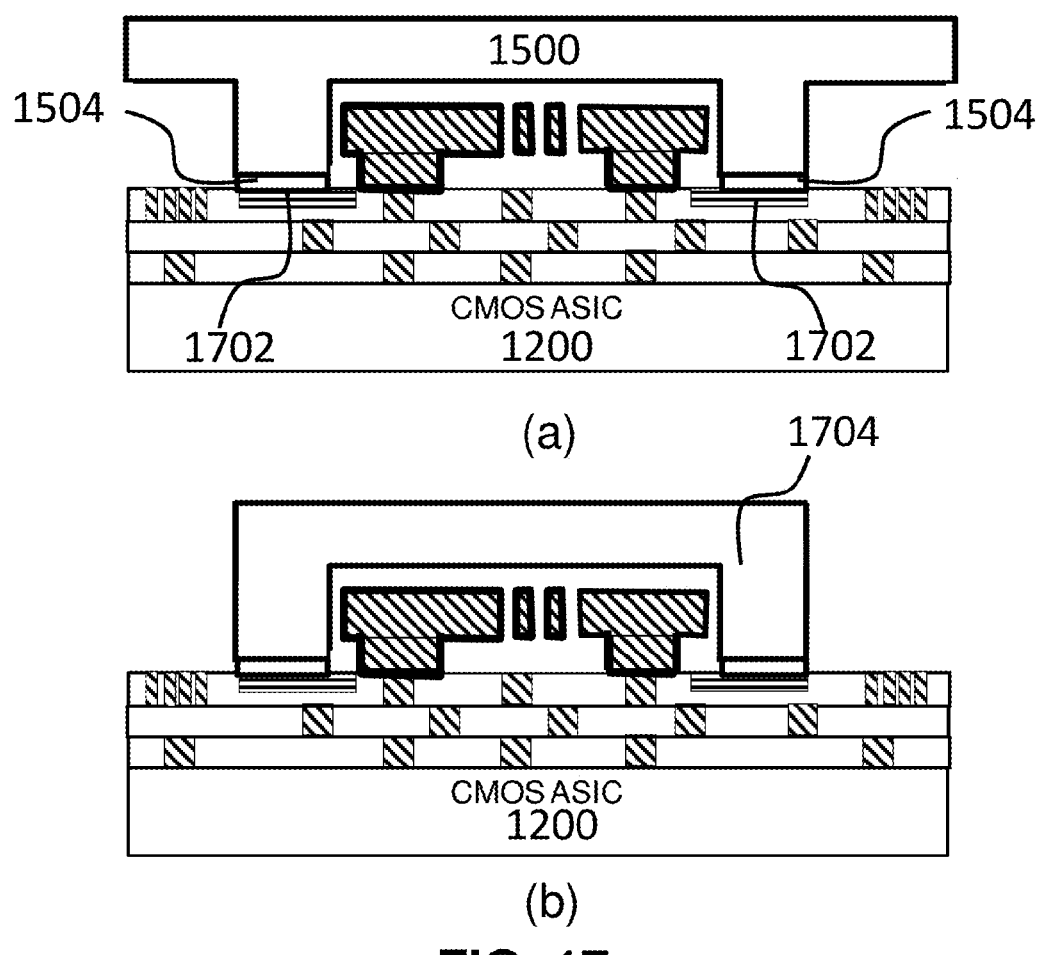
FIGS. 17a and 17b show preferred processing steps of bonding the cap wafer to the CMOS ASIC substrate using bonding pads defined in the post-processing on the CMOS ASIC substrate, according to an embodiment of the present invention.

Referring to FIG. 17*a*, the wafer-scale cap 1500 is bonded to the CMOS ASIC wafer 1200 via the bonding-pads 1702 fabricated directly on the last interconnect layer of the CMOS ASIC wafer 1200. The bonding process has to be performed at low temperatures not exceeding 450° C. to preserve the integrity of the CMOS circuitry. Such a bonding can include, but is not limited to indium-gold, aluminum-germanium or eutectic metal bonding. As such, the bonding pads have to be chosen accordingly. Alternatively, a layer of the desired material can be deposited and patterned on the CMOS ASIC substrate to achieve this requirement. As mentioned previously, the sealed cavity can either be hermetic or not depending on the functionality of the MEMS device elements. Finally, the wafer-scale cap 1500 is further processed through lithography and etching (e.g., reactive ion etching) to define the individual cap 1704. The full wafer scale assembly can then be diced to form individual dies.

The cap can also be monolithically integrated by processing it simultaneously with, and thus using the same structural material as, the MEMS elements. FIG. 18*a* shows completely post-processed MEMS structures on the CMOS ASIC substrate with the cap legs 1802 simultaneously fabricated following similar processing steps to those outlined in FIG. 12. By performing steps similar to FIGS. 12*b* through 12*f*, the cap top 1804 can be completed, as shown in FIG. 18*b*. The holes in 1804 are left to enable the etching of the mold/sacrificial layer. These holes can be closed by performing a final deposition of the structural material using PVD, CVD, electro or electro-less deposition, to form the final cap structure 1806 of FIG. 18*c*. The pressure in the cavity will be determined by the pressure at which the final deposition to close the holes will be performed.

Figure 18:
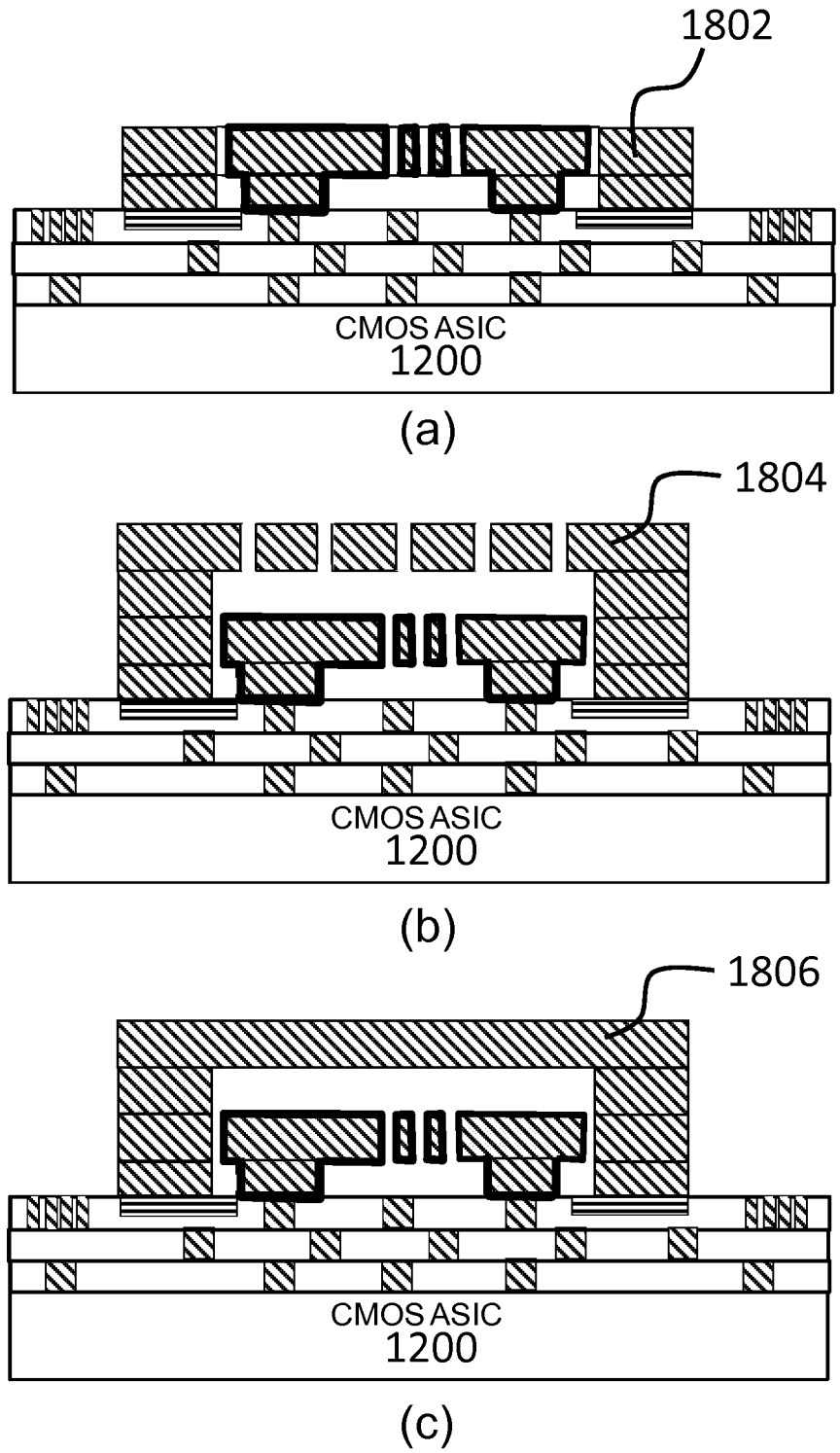
FIGS. 18a through 18c show another preferred processing of capping the MEMS assembly, where the cap is monolithically post-processed on the CMOS ASIC substrate simultaneously with the MEMS elements.
Figure 19:
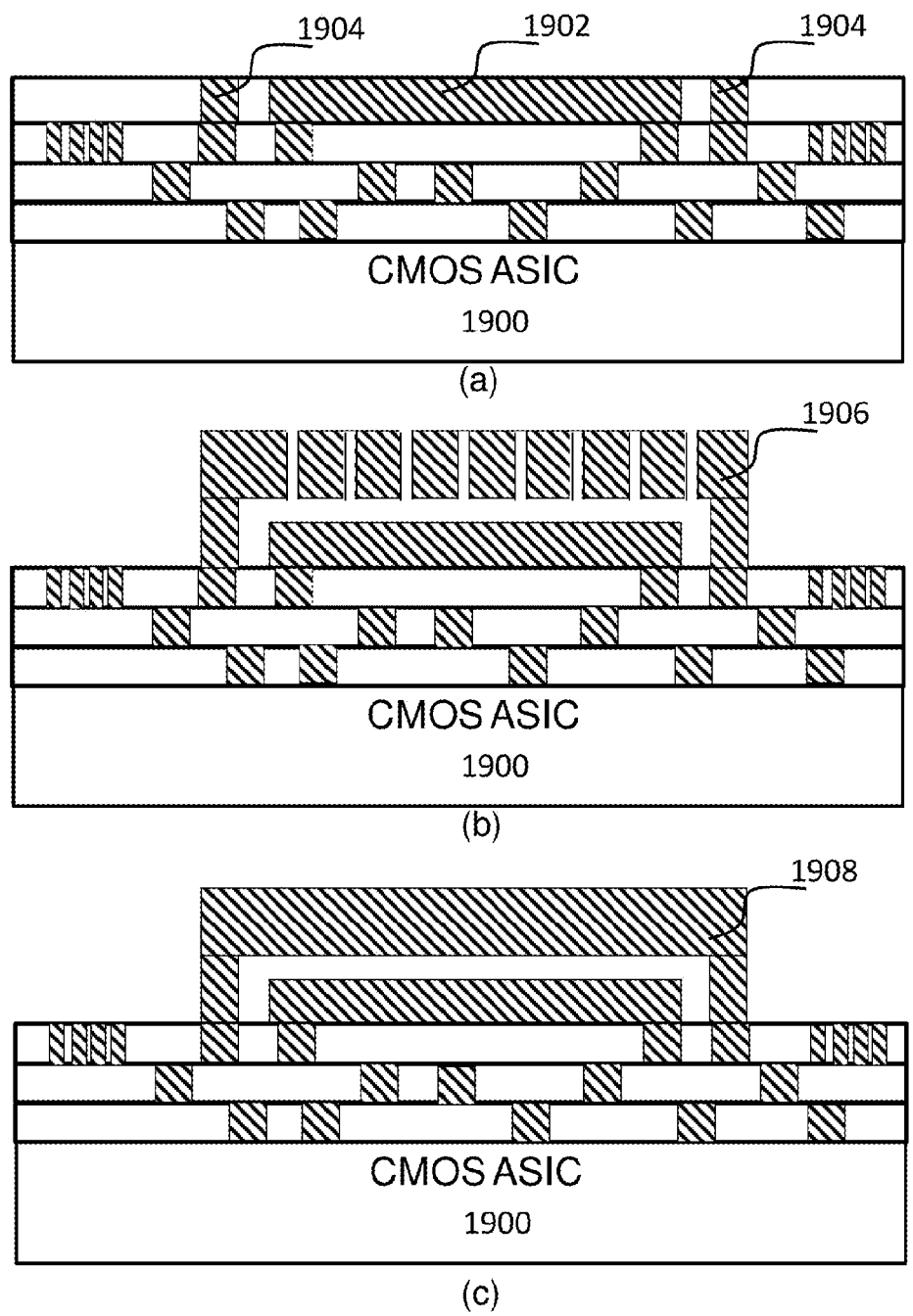
FIGS. 19a through 19c show one of the preferred post-processing on the CMOS ASIC substrate of by direct processing steps on the ASIC interconnect layers in which MEMS structures, with movable and non movable parts, require a gap maintained at a certain pressure (ambient or otherwise), according to an embodiment of the present invention.

A similar process to that described in FIG. 18 can also be used to post-process MEMS structures described in FIGS. 5 and 6, wherein two closely spaced electrodes, one movable and another non movable with a gap maintained at a certain pressure (ambient or otherwise), are present. The bottom electrode 1902 and anchors 1904 of the top electrode can be defined using processing steps similar to those of FIGS. 12*a* to 12*f*, as shown in FIG. 19*a*. These processing steps can be repeated to define the rest of the top electrode 1906 as shown in FIG. 19*b*. The holes in 1906 are left to enable the etching of the mold/sacrificial layer. These holes can be closed by performing a final deposition of the structural material using PVD, CVD, electro or electro-less deposition, to form the complete tope electrode structure 1908 of FIG. 19*c*. The pressure in the gap will be determined by the pressure at which the final deposition to close the holes will be performed. For some applications, the holes are required for the device functionality. In the case the MEMS elements require a back access within the CMOS ASIC substrate 1900 as in FIG. 5, further lithography and etching steps can be added to the process steps of FIG. 19. The back access or etch of the CMOS ASIC substrate 1900 can be performed using methods such as, but not limited to, deep reactive ion etching, reactive ion etching, or wet etching in KOH or TMAH-based solutions.

It is to be appreciated that in the case the structural material can corrode, such as, but not limited to, Cu, W, Ti, a protective layer can be deposited. This layer can also act as a diffusion barrier to these structural materials. An example of such a layer could consist, but is not limited to, TiN, TaN, AlN, Pt, Ru, Ta, $In_2O_3$, $SnO_2$, or ITO. This can be accomplished using ALD, CVD, or PVD as in the case of sputtering. The thickness of this layer can range from 0 to 1000 nanometers. It is also to be appreciated that a seed layer might be needed in the case of a plating process, which can be deposited using PVD or CVD processes.

For all aspects described above, in an embodiment, the resulting structures can be utilized to provide compact multi-sensing and actuation platforms suitable to perform highly sensitive signal detection or actuation in a parallel fashion. In one such embodiment, a sensor COMBO in which each sensor is used to detect different motions, with high signal to noise ratio, associated with a larger device in which the sensing platform is compactly housed. In general, embodiments described herein may be suitable for a variety of implementations involving high sensitivity electromechanical sensors with or without movable parts, as well as actuators. While inertial sensors are the preferred application, the embodiments of the present invention can be applied to other MEMS devices such as resonators, switches, optical devices, etc.

As used herein, a "sensor" refers to a substance or device that detects or senses an electrical signal created by movement of electrons, including but not limited to electrical resistance, current, voltage and capacitance. That is, the sensor can detect signals in the form of current, or detect voltage, or detect charge, or impedance or magnetic field, or a combination thereof. A multi-sensor array has one or more sensors integrated on a single chip.

Thus, embodiments of the present invention include the post-processing of MEMS device elements directly on the CMOS ASIC substrate with capping.

In an embodiment, the MEMS device elements, can be sensors or an actuators, with or without moveable parts anchored on the CMOS ASIC wafer with electrical contact provided via the metallic interconnects of the ASIC. The non-movable parts can be embedded within the interconnect layers.

In one embodiment, the MEMS device elements require two closely spaced structures, one movable and another non movable, with a gap maintained at a certain pressure, ambient or otherwise.

In one embodiment, the MEMS device elements require a back etch of the CMOS ASIC substrate for their operation.

In one embodiment, the main structural material of the MEMS device elements is selected from the group consisting of metals and metal alloys, conductive metal oxides and amorphous semiconductors including, but not limited to, Cu, Al, Ag, Ti, W, Au, Pt, Pd, Ru, Ni, Co, Cd, Pb, Zn, amorphous silicon, Cadium Zinc Telluride (CZT), $HfB_2$, $InO_3$, $SnO_2$, Indium Tin Oxide (ITO), or a combination of a few.

In one embodiment, the structural material can be deposited directly on the ASIC interconnects at or below 450 C using deposition techniques including, but not limited to, electroplating, electroless-plating, physical vapor deposition (such as sputtering, thermal and e-beam evaporation), chemical vapor deposition, atomic layer deposition, physical layer deposition.

In one embodiment, the material density is very high, e.g., Cu density of 8900 $kg/m^3$ or W density of 19800 $kg/m^3$ compared to Si density of 2329 $kg/m^3$, enabling much more compact and thinner structures.

In one embodiment, the main structural material has a thickness approximately in the range of 0-100 micrometers.

In one embodiment, the movable parts of the MEMS device elements can move in-plane or out-of-plane, i.e., vertical motion, with driving electrodes fabricated and incorporated on the last interconnect layer of the ASIC for the latter case.

In one embodiment, methods of fabricating a monolithically CMOS integrated MEMS device elements with capping, are defined.

In one embodiment, the methods of fabrication can be vertically repeated multiple times to build multiple layers of MEMS structures, whereby each MEMS layer has a different geometrical shape to enable 3D assembly of MEMS structures on ASIC in a monolithic fashion.

In one embodiment, a thin protective material, selected from the group consisting of, but not limited to, TaN, TiN, AlN, Pt, Ru, Ta, $Ta_2O_5$, $In_2O_3$, $SnO_2$, ITO, $TiO_2$, $SiO_2$, $Y_2O_3$, $Al_2O_3$, $HfO_2$, $ZrO_2$, $ZrSiO_4$, $BaTiO_3$, $BaZrO_3$, Teflon, or other organic materials, is selectively deposited around all exposed surfaces of the main structural material to protect it from oxidizing or corroding during its operational use, and thus improving the stability of the device elements and preventing any drift.

In one embodiment, the bonding pads are defined in the post-processing on the CMOS ASIC substrate, which could be routed to the ground interconnects of the device assembly, to enable the bonding of a cap, thereby creating a hermetically, or non-hermetically, sealed cavity.

In one embodiment, the cap can be lithographically defined to form separate cavities, equal to or larger than 2, once bonded to the CMOS ASIC substrate through different bond-pads, where different pressures can be achieved.

In one embodiment, the cap can be post-processed simultaneously with the MEMS structures using the same structural material.

What is claimed is:

1. A method, comprising:

forming a CMOS ASIC with ASIC interconnect layers including a last interconnect layer with last metallic interconnects to receive MEMS device input signals, contact pads for ASIC processed output signals, and a cap pad;

depositing a first mold layer on the last interconnect layer;

forming a first lithographic pattern on the first mold layer;

etching the first lithographic pattern to form a first etched surface with MEMS anchor windows exposing the last metallic interconnects and first cap sidewall windows exposing the cap pad;

electroplating copper on the first etched surface to form a first electroplated copper surface;

planarizing the first electroplated copper surface to the first mold layer to render electroplated copper anchor structures in the MEMS anchor windows and a first cap sidewall structure in the first cap sidewall windows, wherein the electroplated copper anchor structures in the MEMS anchor windows contact the last metallic interconnects to receive the MEMS device input signals and the first cap sidewall structure is in contact with the cap pad;

depositing a second mold layer on the first mold layer;

forming a second lithographic pattern on the second mold layer;

etching the second lithographic pattern to form a second etched surface with first MEMS feature windows and second cap sidewall windows;

electroplating copper on the second etched surface to form a second electroplated copper surface;

planarizing the second electroplated copper surface to the second mold layer to expose electroplated copper MEMS features and a second cap sidewall structure, such that the electroplated copper MEMS features reside within the first cap sidewall structure and the second cap sidewall structure;

depositing a third mold layer on the second mold layer;

forming a third lithographic pattern on the third mold layer;

etching the third lithographic pattern to form a third etched surface with third cap sidewall windows;

electroplating copper on the third etched surface to form a third electroplated copper surface;

planarizing the third electroplated copper surface to the third mold layer to render a third cap sidewall structure;

depositing a fourth mold layer on the third mold layer;

forming a fourth lithographic pattern on the fourth mold layer;

etching the fourth lithographic pattern to form a fourth etched surface with a cap ceiling window;

electroplating copper on the fourth etched surface to form a fourth electroplated copper surface; and planarizing the fourth electroplated copper surface to render a cap ceiling enclosing the electroplated copper MEMS structure features.

2. The method of claim 1 further comprising depositing a protective layer on the first etched surface.

3. The method of claim 2 wherein the protective layer is selected from TiN, TaN, MN, Pt, Ru, Ti, W, Ta, $In_2O_3$, $SnO_2$ and Indium-Tin-Oxide.

4. The method of claim 2 wherein the protective layer is up to 1000 nanometers thick.

5. The method of claim 1 further comprising depositing a protective film on the electroplated copper MEMS features.

6. The method of claim 5 wherein the protective film is a metal oxide.

7. The method of claim 6 wherein the metal oxide is selected from $Ta_2O_5$, $In_2O_3$, $SnO_2$, Indium-Tin-Oxide, $TiO_2$, $SiO_2$, $Y_2O_3$, $Al_2O_3$, $HfO_2$, $ZrO_2$, $ZrSiO_4$, $BaTiO_3$, and $BaZrO_3$.

8. The method of claim 5 wherein the protective film is deposited using one of atomic layer deposition, chemical vapor deposition and physical vapor deposition.

9. The method of claim 5 wherein the protective film is operative to prevent corrosion and diffusion of electroplated copper during the processing and operation of the electroplated copper MEMS features.

10. The method of claim 1 wherein the cap ceiling has at least one hole to facilitate processing of features beneath the cap ceiling.

11. The method of claim 10 further comprising sealing the at least one hole to form a sealed cavity.

12. The method of claim 11 wherein sealing is performed using PVD, CVD electro deposition or electro-less deposition.

13. The method of claim 11 wherein sealing is performed using a material selected from semiconductors, metals, metal alloys, metal oxides and dielectrics, including, but not limited to Cu, Al, Ag, W, Pt, Pd, Ru, Co, Cd, Pb, Zn, Cadium Zinc Telluride (CZT), $HfB_2$, $In_2O_3$, $SnO_2$, Indium Tin Oxide (ITO) or a combination thereof.

14. The method of claim 11 wherein pressure in the sealed cavity is determined by the pressure at which sealing is performed.

15. The method of claim 1 further comprising accessing the last interconnect layer by back etching.

16. The method of claim 15 wherein back etching is selected from deep reactive ion etching, reactive ion etching, and wet etching in KOH or TMAH-based solutions.

* * * * *